United States Patent
Rew et al.

(10) Patent No.: US 11,859,330 B2
(45) Date of Patent: Jan. 2, 2024

(54) DRAIN PUMP DRIVING APPARATUS AND LAUNDRY TREATMENT MACHINE INCLUDING THE SAME

(71) Applicant: LG ELECTRONICS INC., Seoul (KR)

(72) Inventors: Jeongbin Rew, Seoul (KR); Junho Lee, Seoul (KR); Chungill Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 402 days.

(21) Appl. No.: 17/258,107

(22) PCT Filed: Jul. 5, 2019

(86) PCT No.: PCT/KR2019/008282
§ 371 (c)(1),
(2) Date: Jan. 5, 2021

(87) PCT Pub. No.: WO2020/009525
PCT Pub. Date: Jan. 9, 2020

(65) Prior Publication Data
US 2021/0285140 A1    Sep. 16, 2021

(30) Foreign Application Priority Data
Jul. 6, 2018   (KR) .................. 10-2018-0079040

(51) Int. Cl.
*D06F 34/10* (2020.01)
*D06F 37/30* (2020.01)
(Continued)

(52) U.S. Cl.
CPC .............. *D06F 34/10* (2020.02); *D06F 23/04* (2013.01); *D06F 33/42* (2020.02); *D06F 37/30* (2013.01);
(Continued)

(58) Field of Classification Search
CPC ...................................................... D06F 34/10
See application file for complete search history.

(56) References Cited

U.S. PATENT DOCUMENTS

2017/0233926 A1* 8/2017 Jung ..................... H02P 6/08
68/12.16

FOREIGN PATENT DOCUMENTS

| JP | 2007-110780 | 4/2007 |
| JP | 2013-059202 | 3/2013 |

(Continued)

OTHER PUBLICATIONS

International Search Report (with English Translation) and Written Opinion dated Oct. 31, 2019 issued in Application No. PCT/KR2019/008282.

*Primary Examiner* — Jason Y Ko
(74) *Attorney, Agent, or Firm* — KED & Associates LLP

(57) ABSTRACT

The present disclosure relates to a drain pump driving apparatus and a laundry treatment machine including the same. A drain pump driving apparatus according to an embodiment of the present disclosure includes: a converter; a voltage dropper to drop the DC voltage from the converter; an inverter module to operate based on a first voltage from the voltage dropper and to output AC voltage converted by a switching operation to a drain pump motor; a controller to operate based on a second voltage from the voltage dropper and to control the inverter module; and a voltage adjuster to adjust the level of voltage information of the motor outputted from the inverter module and to output the adjusted voltage information to the controller. Accordingly, it is possible to stably drive the drain motor.

18 Claims, 13 Drawing Sheets

(51) Int. Cl.
*D06F 33/42* (2020.01)
*D06F 23/04* (2006.01)
*D06F 39/08* (2006.01)
*F04D 13/06* (2006.01)
*F04D 15/00* (2006.01)
*H02P 27/08* (2006.01)
*H03F 3/45* (2006.01)
*D06F 105/46* (2020.01)
*D06F 105/08* (2020.01)

(52) U.S. Cl.
CPC .......... *D06F 37/304* (2013.01); *D06F 39/085* (2013.01); *F04D 13/06* (2013.01); *F04D 15/0066* (2013.01); *H02P 27/08* (2013.01); *H03F 3/45475* (2013.01); *D06F 2105/08* (2020.02); *D06F 2105/46* (2020.02)

(56) References Cited

FOREIGN PATENT DOCUMENTS

| | | |
|---|---|---|
| JP | 2013-235625 | 11/2013 |
| JP | 2017-184940 | 10/2017 |
| KR | 10-1449513 | 10/2014 |

\* cited by examiner

DRAIN PUMP DRIVING APPARATUS AND LAUNDRY TREATMENT MACHINE INCLUDING THE SAME

CROSS-REFERENCE TO RELATED PATENT APPLICATIONS

This application is a U.S. National Stage Application under 35 U.S.C. § 371 of PCT Application No. PCT/KR2019/008282, filed Jul. 5, 2019, which claims priority to Korean Patent Application No. 10-2018-0079040, filed Jul. 6, 2018, whose entire disclosures are hereby incorporated by reference.

BACKGROUND OF THE DISCLOSURE

1. Field of the Disclosure

The present disclosure relates to a drain pump driving apparatus and a laundry treatment machine including the same, and more particularly, to a drain pump driving apparatus capable of stably driving a drain motor and a laundry treatment machine including the same.

Further, the present disclosure relates to a drain pump driving apparatus capable of driving in a sensorless manner and a laundry treatment machine including the same.

Further, the present disclosure relates to a laundry treatment machine capable of improving the stability of a converter.

Further, the present disclosure relates to a laundry treatment machine capable of reducing the period of time for completion of drainage.

2. Description of the Related Art

A drain pump driving apparatus drains out water entering a water inlet by driving a motor during drainage.

When using an AC pump motor in order to drive a drain pump, the motor is normally driven by a constant speed operation with an input AC voltage.

For example, when the frequency of the input AC voltage is 50 Hz, the drain pump motor rotates at 3,000 rpm, and, when the frequency of the input AC voltage is 60 Hz, the drain pump motor rotates at 3,600 rpm.

Such an AC pump motor has a drawback such as an extended period of time for completion of drainage because the speed of the motor is not controlled during drainage.

In order to address the drawback, researches are being conducted to apply a DC brushless motor as a drain pump motor.

SUMMARY

The present disclosure provides a drain pump driving apparatus capable of stably driving a drain motor and a laundry treatment machine including the same.

The present disclosure also provides a drain pump driving apparatus capable of driving in a sensorless manner and a laundry treatment machine including the same.

The present disclosure also provides a laundry treatment machine capable of driving a drain pump motor in a sensorless manner.

The present disclosure also provides a laundry treatment machine capable of improving stability of a converter.

The present disclosure also provides a laundry treatment machine capable of shortening a drainage completion period.

An embodiment of the present disclosure provides a drain pump driving apparatus and a laundry treatment machine including the same, the drain pump driving apparatus including: a converter to convert alternating current (AC) voltage into direct current (DC) voltage; a voltage dropper to drop the DC voltage from the converter; an inverter module to operate based on a first voltage from the voltage dropper and to output AC voltage converted by a switching operation to a drain pump motor; a controller to operate based on a second voltage from the voltage dropper and to control the inverter module; and a voltage adjuster to adjust the level of voltage information of the motor outputted from the inverter module and to output the adjusted voltage information to the controller.

In the drain pump driving apparatus and laundry treatment machine including the same according to the embodiment of the present disclosure, the drain pump driving apparatus may further include an amplifier to amplify the output current flowing in the motor outputted from the inverter module and to output information regarding the amplified output current to the controller.

In the drain pump driving apparatus and laundry treatment machine including the same according to the embodiment of the present disclosure, the drain pump driving apparatus may further include a regulator to convert the level of the second voltage from the voltage dropper and to output a converted third voltage to the controller, wherein the level of the third voltage may be lower than the level of the first voltage.

In the drain pump driving apparatus and laundry treatment machine including the same according to the embodiment of the present disclosure, the drain pump driving apparatus may further include: an RC filter for filtering signal outputted from the controller; and a voltage distributor for performing voltage distribution of signal filtered by the RC filter and outputting the voltage-distributed signals to the inverter module.

In the drain pump driving apparatus and laundry treatment machine including the same according to the embodiment of the present disclosure, the drain pump driving apparatus may further include: an RC filter for filtering signal outputted by the voltage adjuster, wherein the voltage adjuster may have a transistor and adjust the level of the voltage information of the motor outputted from the inverter module and outputs the adjusted voltage information, based on the turn-on of the transistor.

In the drain pump driving apparatus and laundry treatment machine including the same according to the embodiment of the present disclosure, the controller may output a timer signal, a rotational direction signal, and a voltage command value to the inverter module.

In the drain pump driving apparatus and laundry treatment machine including the same according to the embodiment of the present disclosure, the controller may calculate the speed of the motor based on the voltage information of the motor.

In the drain pump driving apparatus and laundry treatment machine including the same according to the embodiment of the present disclosure, the drain pump driving apparatus may further include a second inverter module to operate based on the first voltage from the voltage dropper and to output converted AC voltage by a switching operation to a circulation pump motor, wherein the controller may control the second inverter module.

In the drain pump driving apparatus and laundry treatment machine including the same according to the embodiment of the present disclosure, the drain pump driving apparatus may further include: a second voltage adjuster to adjust the level of voltage information of the circulation pump motor outputted from the second inverter module and to output the adjusted voltage information to the controller.

Another embodiment of the present disclosure provides a drain pump driving apparatus and a laundry treatment machine including the same, the drain pump driving apparatus including: a converter to convert alternating current (AC) voltage into direct current (DC) voltage; a voltage dropper to drop the DC voltage from the converter; an inverter module to operate based on a first voltage from the voltage dropper and to output AC voltage converted by a switching operation to a drain pump motor; and a controller to operate based on the first voltage form the voltage dropper and to control the inverter module.

Advantageous Effects

According to an embodiment of the present disclosure, there are provided a drain pump driving apparatus and a laundry treatment machine including the same, the drain pump driving apparatus including: the drain pump driving apparatus including: a converter to convert alternating current (AC) voltage into direct current (DC) voltage; a voltage dropper to drop the DC voltage from the converter; an inverter module to operate based on a first voltage from the voltage dropper and to output AC voltage converted by a switching operation to a drain pump motor; a controller to operate based on a second voltage from the voltage dropper and to control the inverter module; and a voltage adjuster to adjust the level of voltage information of the motor outputted from the inverter module and to output the adjusted voltage information to the controller. Accordingly, it is possible to stably drive the drain motor. Particularly, it is possible to adjust the voltage difference between the inverter module and the controller.

In the drain pump driving apparatus and laundry treatment machine including the same according to the embodiment of the present disclosure, the drain pump driving apparatus may further include an amplifier to amplify the output current flowing in the motor outputted from the inverter module and to output information regarding the amplified output current to the controller. Accordingly, it is possible to stably drive the drain motor.

In the drain pump driving apparatus and laundry treatment machine including the same according to the embodiment of the present disclosure, the drain pump driving apparatus may further include a regulator to convert the level of the second voltage from the voltage dropper and to output a converted third voltage to the controller, wherein the level of the third voltage may be lower than the level of the first voltage. Accordingly, it is possible to stably drive the drain motor.

In the drain pump driving apparatus and laundry treatment machine including the same according to the embodiment of the present disclosure, the drain pump driving apparatus may further include: an RC filter for filtering signal outputted from the controller; and a voltage distributor for performing voltage distribution of signal filtered by the RC filter and outputting the voltage-distributed signals to the inverter module. Accordingly, it is possible to stably drive the drain motor.

In the drain pump driving apparatus and laundry treatment machine including the same according to the embodiment of the present disclosure, the drain pump driving apparatus may further include: an RC filter for filtering signal outputted by the voltage adjuster, wherein the voltage adjuster may have a transistor and adjust the level of the voltage information of the motor outputted from the inverter module and outputs the adjusted voltage information, based on the turn-on of the transistor. Accordingly, it is possible to adjust the voltage difference between the inverter module and the controller.

In the drain pump driving apparatus and laundry treatment machine including the same according to the embodiment of the present disclosure, the controller may output a timer signal, a rotational direction signal, and a voltage command value to the inverter module. Accordingly, it is possible to stably drive the drain motor.

In the drain pump driving apparatus and laundry treatment machine including the same according to the embodiment of the present disclosure, the controller may calculate the speed of the motor based on the voltage information of the motor. Accordingly, it is possible to stably drive the drain motor.

In the drain pump driving apparatus and laundry treatment machine including the same according to the embodiment of the present disclosure, the drain pump driving apparatus may further include a second inverter module to operate based on the first voltage from the voltage dropper and to output converted AC voltage by a switching operation to a circulation pump motor, wherein the controller may control the second inverter module. Accordingly, it is possible to stably drive the circulation pump motor as well as the drain motor.

In the drain pump driving apparatus and laundry treatment machine including the same according to the embodiment of the present disclosure, the drain pump driving apparatus may further include: a second voltage adjuster to adjust the level of voltage information of the circulation pump motor outputted from the second inverter module and to output the adjusted voltage information to the controller. Accordingly, it is possible to stably drive the circulation pump motor as well as the drain motor.

Particularly, since power control allows for driving at constant power, the converter supplies constant power, thereby improving the stability of the converter.

Another embodiment of the present disclosure provides a drain pump driving apparatus and a laundry treatment machine including the same, the drain pump driving apparatus including: a converter to convert alternating current (AC) voltage into direct current (DC) voltage; a voltage dropper to drop the DC voltage from the converter; an inverter module to operate based on a first voltage from the voltage dropper and to output AC voltage converted by a switching operation to a drain pump motor; and a controller to operate based on the first voltage form the voltage dropper and to control the inverter module. Accordingly, it is possible to stably drive the drain motor.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE PREFERRED EMBODIMENTS

Reference will now be made in detail to the preferred embodiments of the present disclosure, examples of which are illustrated in the accompanying drawings. Wherever possible, the same reference numbers will be used throughout the drawings to refer to the same or like parts.

As used herein, the suffixes "module" and "unit" are added or used interchangeably to facilitate preparation of this specification and are not intended to suggest distinct meanings or functions. Accordingly, the terms "module" and "unit" may be used interchangeably.

Figure 1:
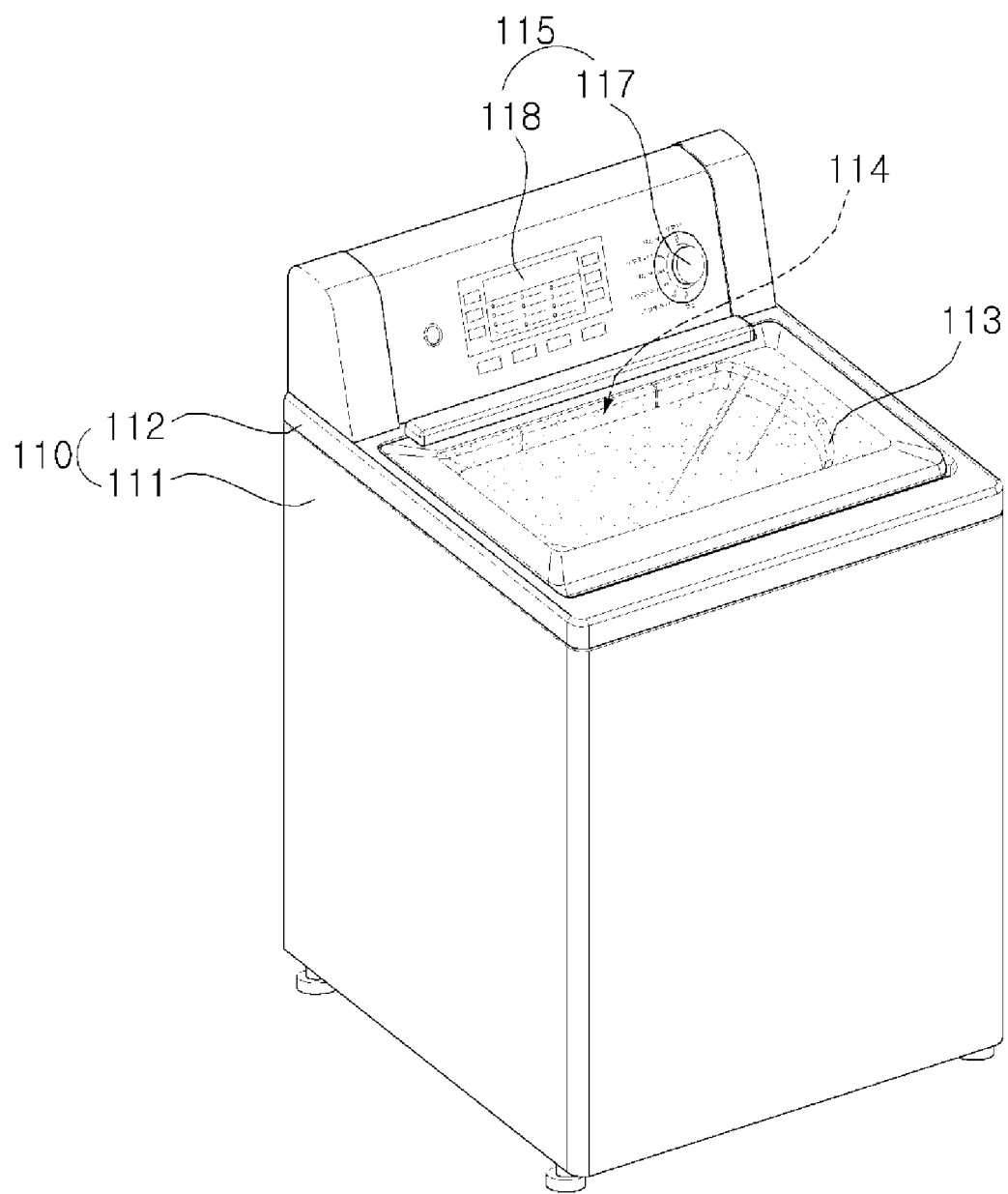
FIG. 1 is a perspective view illustrating a laundry treatment machine according to an embodiment of the present disclosure.
Figure 2:
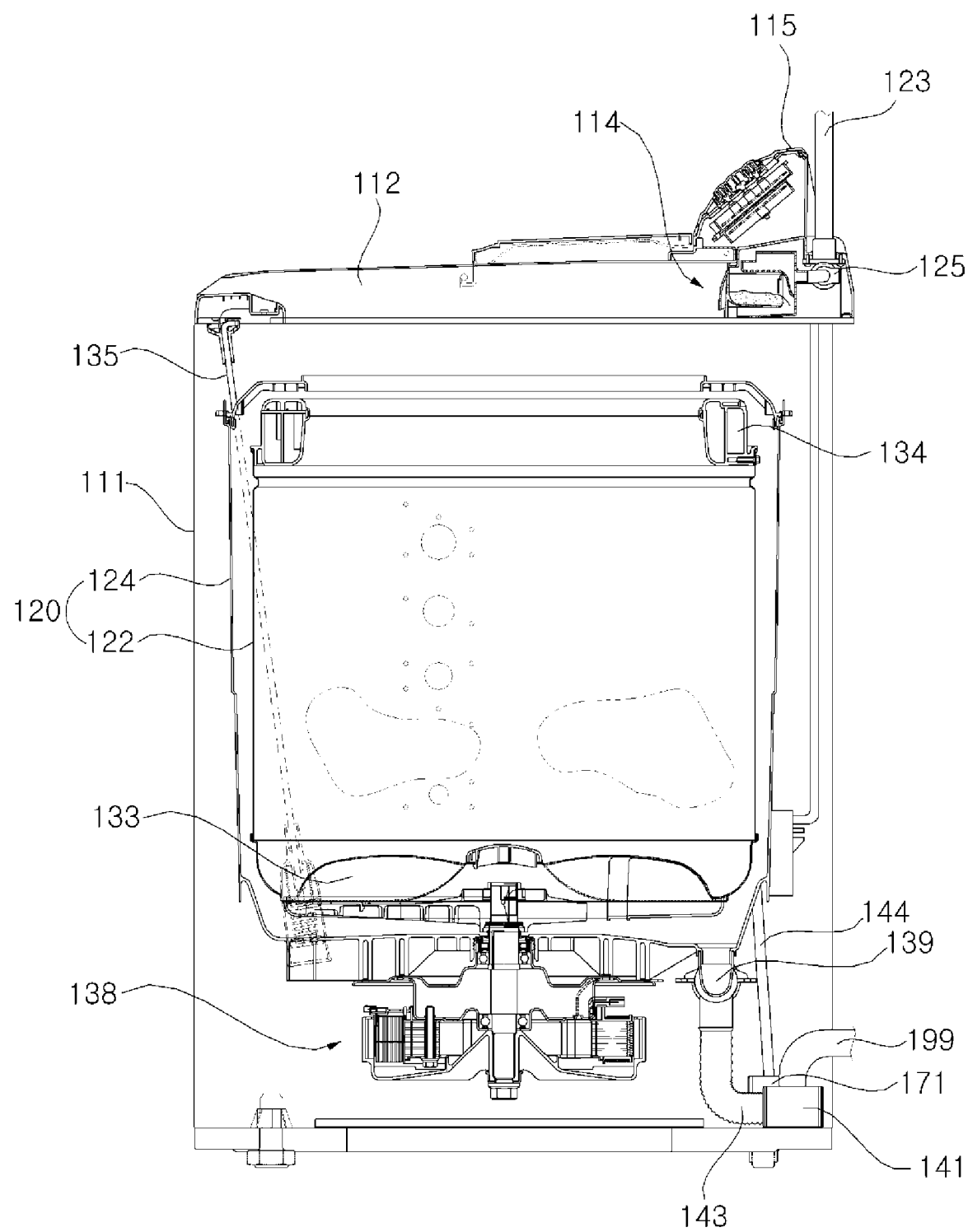
FIG. 2 is a side cross-sectional view of the laundry treatment machine of FIG. 1.

FIG. 1 is a perspective view illustrating a laundry treatment machine according to an embodiment of the present disclosure, and FIG. 2 is a side cross-sectional view illustrating the laundry treatment machine of FIG. 1.

Referring to FIGS. 1 and 2, the laundry treatment machine 100 according to an embodiment of the present disclosure conceptually includes a washing machine having fabric inserted therein for performing washing, rinsing and dewatering, or a dryer having wet fabric inserted therein. The washing machine will be mainly described below.

The washing machine 100 includes a casing 110 forming an outer appearance, operation keys for receiving various control commands from a user, and a control panel 115 equipped with a display for displaying information on the operating state of the washing machine 100 to provide a user interface, and a door 113 rotatably installed in the casing 110 to open and close an entrance hole through which the laundry enters and exits.

The casing 110 includes a body 111 for defining a space in which various components of the washing machine 100 can be accommodated and a top cover 112 provided at an upper side of the body 111 and forming a fabric entrance hole to allow the laundry to be introduced into an inner tub 122 therethrough.

The casing 110 is described as including the body 111 and the top cover 112, but the casing 110 is not limited thereto as long as it forms the appearance of the washing machine 100.

A support rod 135 is coupled to the top cover 112 which is one of the constituent elements of the casing 110. However, the support rod 135 is not limited thereto and may be coupled to any part of the fixed portion of the casing 110.

The control panel 115 includes operation keys 117 for controlling an operation state of the laundry treatment machine 100 and a display 118 disposed on one side of the operation keys 117 to display the operation state of the laundry treatment machine 100.

The door 113 opens and closes a fabric entrance hole (not shown) formed in the top cover 112 and may include a transparent member such as reinforced glass to allow the inside of the body 111 to be seen.

The washing machine 100 may include a washing tub 120. The washing tub 120 may include an outer tub 124 containing wash water and an inner tub 122 rotatably installed in the outer tub 124 to accommodate laundry. A balancer 134 may be provided at the upper portion of the washing tub 120 to compensate for unbalance amount generated when the washing tub 120 rotates.

Meanwhile, the washing machine 100 may include a pulsator 133 rotatably provided at a lower portion of the washing tub 120.

The driving apparatus 138 serves to provide a driving force for rotating the inner tub 122 and/or the pulsator 133. A clutch (not shown) for selectively transmitting the driving force of the driving apparatus 138 may be provided such that only the inner tub 122 is rotated, only the pulsator 133 is rotated, or the inner tub 122 and the pulsator 133 are rotated at the same time.

Figure 3:
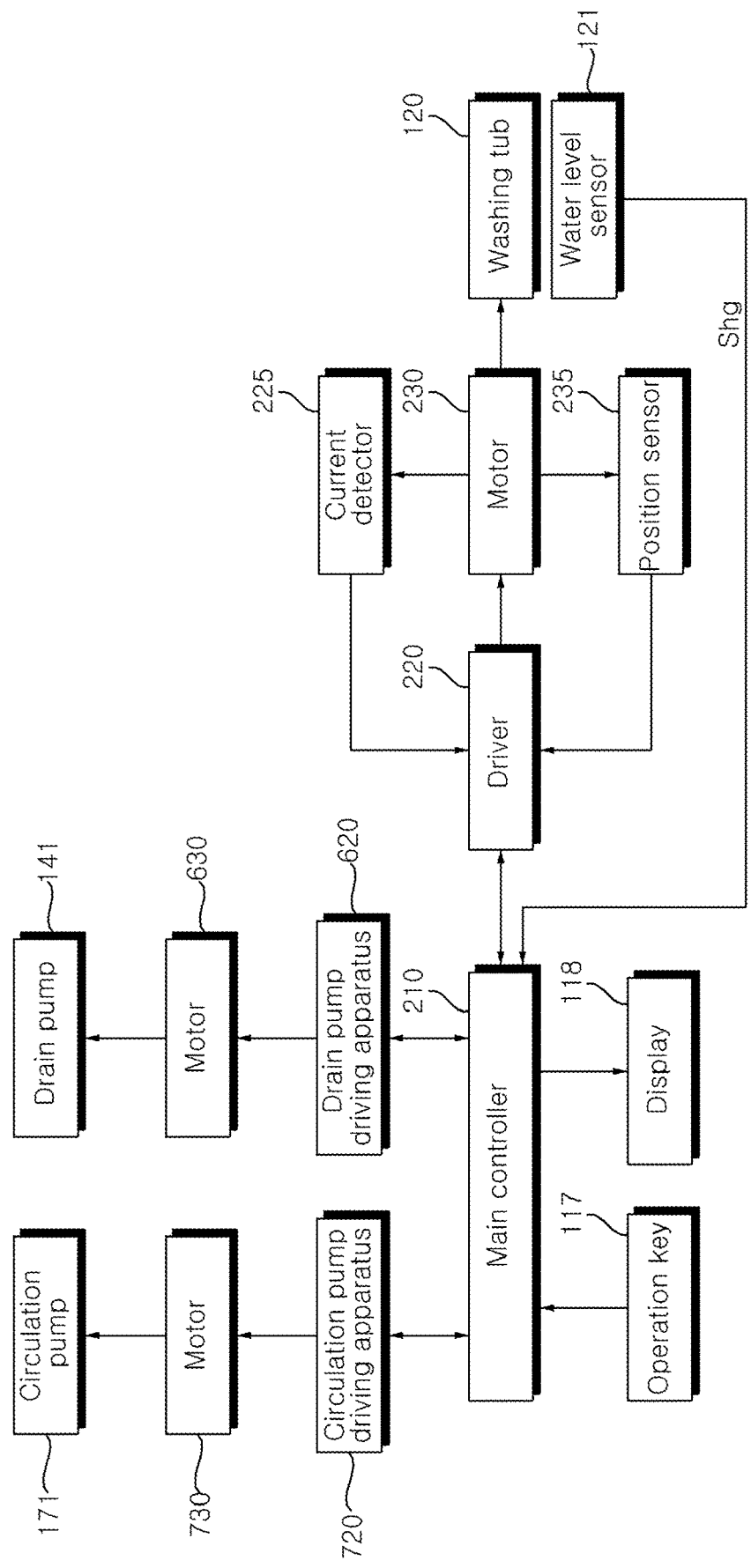
FIG. 3 is an internal block diagram of the laundry treatment machine of FIG. 1.

The driving apparatus 138 is operated by a driver 220 of FIG. 3, that is, a driving circuit. This will be described later with reference to FIG. 3 and other drawings.

A detergent box 114 for accommodating various additives such as a laundry detergent, a fabric softener, and/or a bleaching agent is retrievably provided to the top cover 112, and the wash water supplied through a water supply channel 123 flows into the inner tub 122 via the detergent box 114.

A plurality of holes (not shown) is formed in the inner tub 122. Thereby, the wash water supplied to the inner tub 122 flows to the outer tub 124 through the plurality of holes. A water supply valve 125 for regulating the water supply channel 123 may be provided.

The wash water is drained from the outer tub 124 through a drain channel 143. A drain valve 145 for regulating the drain channel 143 and a drain pump 141 for pumping the wash water may be provided.

Moreover, a circulation pump 171 for pumping wash water may be provided on an end of the drain channel 143. The wash water pumped by the circulation pump 171 may be introduced into a washing tub 120 through a circulation channel 144.

The support rod 135 is provided to hang the outer tub 124 in the casing 110. One end of the support rod 135 is connected to the casing 110 and the other end of the support rod 135 is connected to the outer tub 124 by a suspension 150.

The suspension 150 attenuates vibration of the outer tub 124 during the operation of the washing machine 100. For example, the outer tub 124 may be vibrated by vibration generated as the inner tub 122 rotates. While the inner tub 122 rotates, the vibration caused by various factors such as unbalance laundry amount of laundry in the inner tub 122, the rotational speed of the inner tub 122 or the resonance characteristics of the inner tub 122 can be attenuated.

FIG. 3 is an internal block diagram of the laundry treatment machine of FIG. 1.

Referring to FIG. 3, in the laundry treatment machine 100, the driver 220 is controlled by the main controller 210, and the driver 220 drives the motor 230. Thereby, the washing tub 120 is rotated by the motor 230.

Meanwhile, the laundry treatment machine 100 may include a motor 630 for driving the drain pump 141 and a drain pump driving apparatus 620 for driving the motor 630. The drain pump driving apparatus 620 may be controlled by the main controller 210.

Meanwhile, the laundry treatment machine 100 may include a motor 730 for driving the circulation pump 171 and a circulation pump driving apparatus 720 for driving the motor 730. The circulation pump driving apparatus 720 may be controlled by the main controller 210.

In this specification, the drain pump driving apparatus 620 may be referred to as a drain pump driver.

The main controller 210 operates by receiving an operation signal from an operation key 117. Accordingly, washing, rinsing, and dewatering processes may be performed.

In addition, the main controller 210 may control the display 118 to display a washing course, a washing time, a dewatering time, a rinsing time, a current operation state, or the like.

Meanwhile, the main controller 210 controls the driver 220 to operate the motor 230. For example, the main controller 210 may control the driver 220 to rotate the motor 230, based on a current detector 225 for detecting an output current flowing in the motor 230 and a position sensor 235 for sensing a position of the motor 230. While it is illustrated in FIG. 3 that the detected current and the sensed position signal are input to the driver 220, embodiments of the present disclosure are not limited thereto. The detected current and the sensed position signal may be input to the main controller 210 or to both the main controller 210 and the driver 220.

The driver 220, which serves to drive the motor 230, may include an inverter (not shown) and an inverter controller (not shown). In addition, the driver 220 may further include a converter or the like for supplying a direct current (DC) voltage input to the inverter (not shown).

For example, when the inverter controller (not shown) outputs a switching control signal in a pulse width modulation (PWM) scheme to the inverter (not shown), the inverter (not shown) may perform a high-speed switching operation to supply an alternating current (AC) voltage at a predetermined frequency to the motor 230.

The main controller 210 may sense a laundry amount based on a current io detected by the current detector 225 or a position signal H sensed by the position sensor 235. For example, while the washing tub 120 rotates, the laundry amount may be sensed based on the current value io of the motor 230.

The main controller 210 may sense an amount of eccentricity of the washing tub 120, that is, an unbalance (UB) of the washing tub 120. The sensing of the amount of eccentricity may be performed based on a ripple component of the current io detected by the current detector 225 or an amount of change in rotational speed of the washing tub 120.

Meanwhile, a water level sensor 121 may measure a water level in the washing tub 120.

For example, a water level frequency at a zero water level with no water in the washing tub 120 may be 28 KHz, and a frequency at a full water level at which water reaches an allowable water level in the washing tub 120 may be 23 KHz.

That is, the frequency of the water level detected by the water level sensor 121 may be inversely proportional to the water level in the washing tub.

The water level Shg in the washing tub output from the water level sensor 121 may be a water level frequency or a water level that is inversely proportional to the water level frequency.

Meanwhile, the main controller 210 may determine whether the washing tub 120 is at a full water level, a zero water level, or a reset water level, based on the water level Shg in the washing tub detected by the water level sensor 121.

Figure 4:
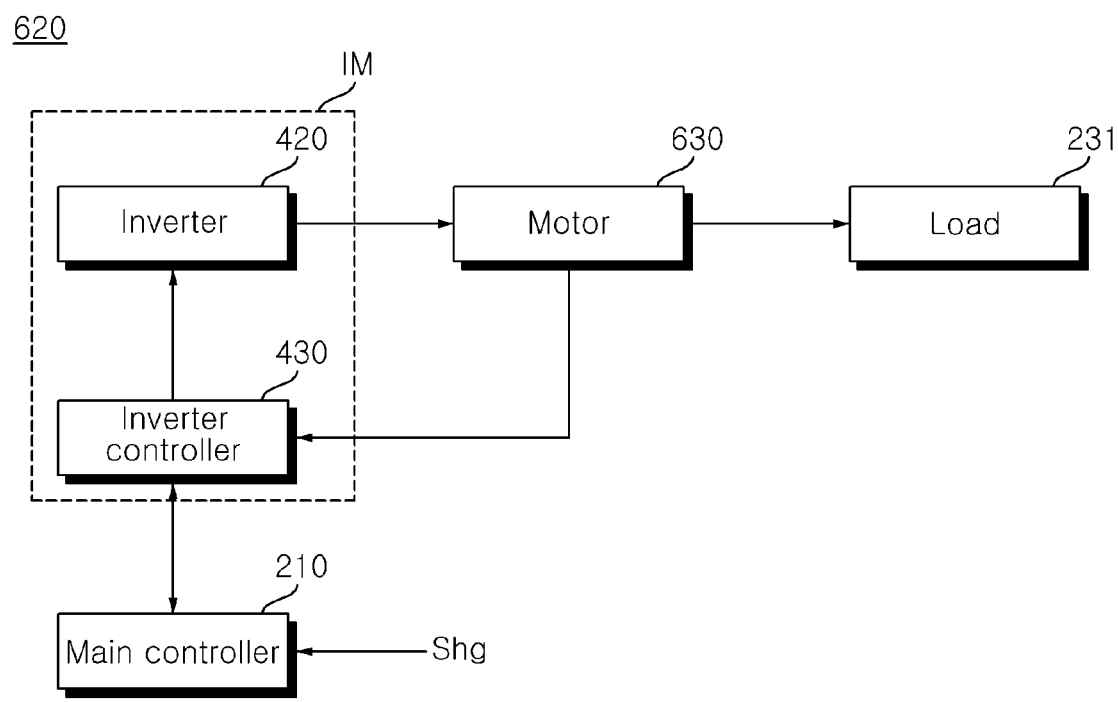
FIG. 4 illustrates an example of an internal block diagram of a drain pump driving apparatus of FIG. 1.
Figure 5:
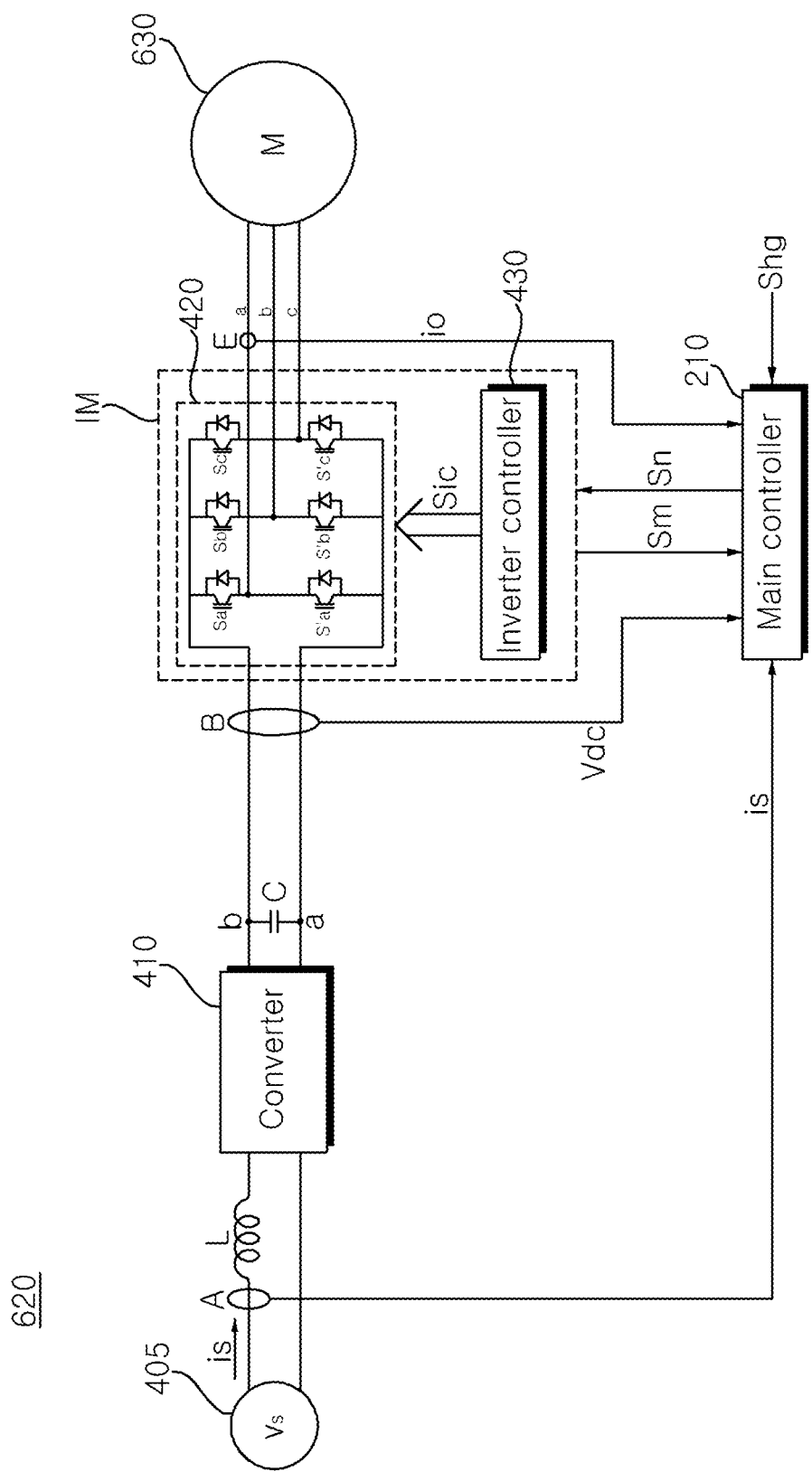
FIG. 5 illustrates an example of an internal circuit diagram of the drain pump driving apparatus of FIG. 4.

FIG. 4 illustrates an example of an internal block diagram of the drain pump driving apparatus of FIG. 1, and FIG. 5 illustrates an example of an internal circuit diagram of the drain pump driving apparatus of FIG. 4.

Referring to FIGS. 4 and 5, the drain pump driving apparatus 620 according to an embodiment of the present disclosure serves to drive the motor 630 in a sensorless manner, and may include an inverter 420, an inverter controller 430, and a main controller 210.

The main controller 210 and the inverter controller 430 may correspond to a controller and a second controller described in this specification, respectively.

The drain pump driving apparatus 620 according to an embodiment of the present disclosure may include a converter 410, a DC terminal voltage detector B, a DC terminal capacitor C, and an output current detector E. In addition, the drain pump driving apparatus 620 may further include an input current detector A and a reactor L.

Hereinafter, an operation of each constituent unit in the drain pump driving apparatus 620 of FIGS. 4 and 5 will be described.

The reactor L is disposed between a commercial AC voltage source 405 (vs) and the converter 410, and performs a power factor correction operation or a boost operation. In addition, the reactor L may also function to limit a harmonic current resulting from high-speed switching of the converter 410.

The input current detector A may detect an input current is is input from the commercial AC voltage source 405. To this end, a current transformer (CT), a shunt resistor, or the like may be used as the input current detector A. The detected input current is is may be input to the inverter controller 430 or the main controller 210 as a discrete signal in the form of a pulse. In FIG. 5, it is illustrated that the detected input current is is input to the main controller 210.

The converter 410 converts the commercial AC voltage source 405 having passed through the reactor L into a DC voltage and outputs the DC voltage. Although the commercial AC voltage source 405 is shown as a single-phase AC voltage source in FIG. 5, it may be a 3-phase AC voltage source. The converter 410 has an internal structure that varies depending on the type of commercial AC voltage source 405.

Meanwhile, the converter 410 may be configured with diodes or the like without a switching device, and may perform a rectification operation without a separate switching operation.

For example, in case of the single-phase AC voltage source, four diodes may be used in the form of a bridge. In case of the 3-phase AC voltage source, six diodes may be used in the form of a bridge.

As the converter 410, for example, a half-bridge type converter having two switching devices and four diodes connected to each other may be used. In case of the 3-phase AC voltage source, six switching devices and six diodes may be used for the converter.

When the converter 410 has a switching device, a boost operation, a power factor correction, and a DC voltage conversion may be performed by the switching operation of the switching device.

Meanwhile, the converter 410 may include a switched mode power supply (SMPS) having a switching device and a transformer.

The converter 410 may convert a level of an input DC voltage and output the converted DC voltage.

The DC terminal capacitor C smooths the input voltage and stores the smoothed voltage. In FIG. 5, one element is exemplified as the DC terminal capacitor C, but a plurality of elements may be provided to secure element stability.

While it is illustrated in FIG. 5 that the DC terminal capacitor C is connected to an output terminal of the converter 410, embodiments of the present disclosure are not limited thereto. The DC voltage may be input directly to the DC terminal capacitor C.

For example, a DC voltage from a solar cell may be input directly to the DC terminal capacitor C or may be DC-to-DC converted and input to the DC terminal capacitor C. Hereinafter, what is illustrated in FIG. 5 will be mainly described.

Both ends of the DC terminal capacitor C may be referred to as DC terminals or DC link terminals because the DC voltage is stored therein.

The DC terminal voltage detector B may detect a voltage Vdc between the DC terminals, which are both ends of the DC terminal capacitor C. To this end, the DC terminal voltage detector B may include a resistance element and an amplifier. The detected DC terminal voltage Vdc may be input to the inverter controller 430 or the main controller 210 as a discrete signal in the form of a pulse. In FIG. 5, it is illustrated that the detected DC terminal voltage Vdc is input to the main controller 210.

The inverter 420 may include a plurality of inverter switching devices. The inverter 420 may convert the smoothed DC voltage Vdc into an AC voltage by an on/off operation of the switching device, and output the AC voltage to the synchronous motor 630.

For example, when the synchronous motor 630 is in a 3-phase type, the inverter 420 may convert the DC voltage Vdc into 3-phase AC voltages va, vb and vc and output the 3-phase AC voltages to the three-phase synchronous motor 630 as shown in FIG. 5.

As another example, when the synchronous motor 630 is in a single-phase type, the inverter 420 may convert the DC voltage Vdc into a single-phase AC voltage and output the single-phase AC voltage to a single-phase synchronous motor 630.

The inverter 420 includes upper switching devices Sa, Sb and Sc and lower switching devices S'a, S'b and S'c. Each of the upper switching devices Sa, Sb and Sc that are connected to one another in series and a respective one of the lower switching devices S'a, S'b and S'c that are connected to one another in series form a pair. Three pairs of upper and lower switching devices Sa and S'a, Sb and S'b, and Sc and S'c are connected to each other in parallel. Each of the switching devices Sa, S'a, Sb, S'b, Sc and S'c is connected with a diode in anti-parallel.

Each of the switching devices in the inverter 420 is turned on/off based on an inverter switching control signal Sic from the inverter controller 430. Thereby, an AC voltage having a predetermined frequency is output to the synchronous motor 630.

The inverter controller 430 may output the switching control signal Sic to the inverter 420.

In particular, the inverter controller 430 may output the switching control signal Sic to the inverter 420, based on a voltage command value Sn input from the main controller 210.

The inverter controller 430 may output voltage information Sm of the motor 630 to the main controller 210, based on the voltage command value Sn or the switching control signal Sic.

The inverter 420 and the inverter controller 430 may be configured as one inverter module IM, as shown in FIG. 4 or 5.

The main controller 210 may control the switching operation of the inverter 420 in a sensorless manner.

To this end, the main controller 210 may receive an output current io detected by the output current detector E and a DC terminal voltage Vdc detected by the DC terminal voltage detector B.

The main controller 210 may calculate a power based on the output current io and the DC terminal voltage Vdc, and output a voltage command value Sn based on the calculated power.

In particular, the main controller 210 may perform power control to stably operate the drain motor 630 and output a voltage command value Sn based on the power control. Accordingly, the inverter controller 430 may output a switching control signal Sic corresponding to the voltage command value Sn based on the power control.

The output current detector E may detect an output current io flowing in the 3-phase motor 630.

The output current E may be disposed between the 3-phase drain motor 630 and the inverter 420 to detect an output current io flowing in the motor. In the drawing, it is illustrated that the a-phase current is detected, out of the phase current ia, ib, and ic which is the output current io flowing in the drain motor 630.

Meanwhile, as opposed to the drawing, the output current detector E may be disposed between the DC terminal capacitor C and the inverter 420 and sequentially detect the output current flowing in the motor. In this case, one shunt resistance element Rs may be used, and the phase current ia, ib, and ic flowing in the drain motor 630 may be detected in a time-division manner.

The detected output current io may be input to the inverter controller 430 or the main controller 210 as a discrete signal in the form of a pulse. In FIG. 5, it is illustrated that the detected output current idc is input to the main controller 210.

The 3-phase motor 630 includes a stator and a rotor. The rotor rotates when the AC voltage at a predetermined frequency for each phase is applied to a coil of the stator for each phase (phase a, b or c).

Such a motor 630 may include a brushless DC (BLDC) motor.

The motor 630 may include, for example, a surface-mounted permanent-magnet synchronous motor (SMPMSM), an interior permanent magnet synchronous motor (IPMSM), and a synchronous reluctance motor (SynRM). The SMPMSM and the IPMSM are permanent magnet synchronous motors (PMSM) employing permanent magnets, while the SynRM has no permanent magnet.

Figure 6:
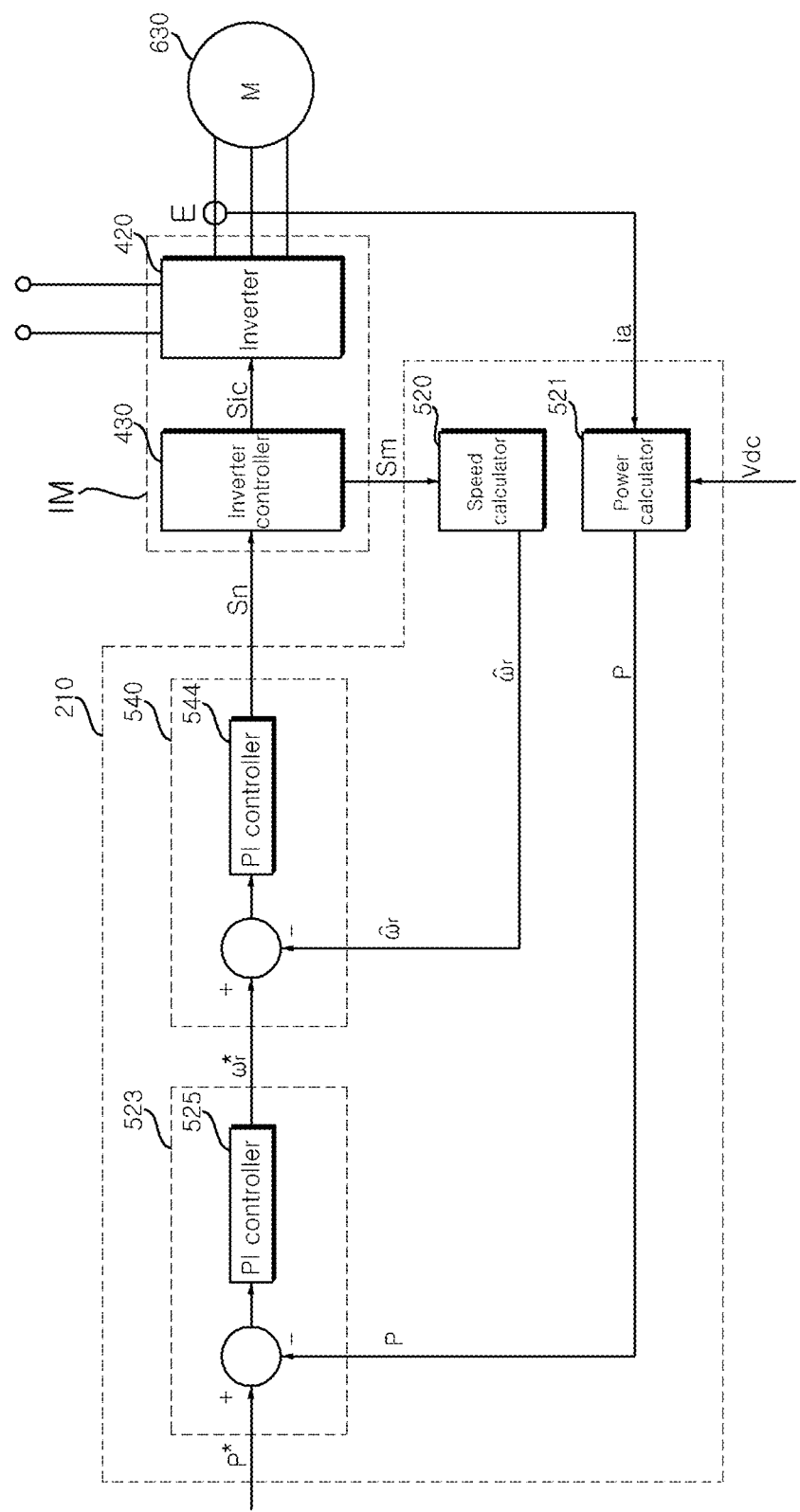
FIG. 6 is an internal block diagram of a main controller of FIG. 5.

FIG. 6 is an internal block diagram of a main controller of FIG. 5.

Referring to FIG. 6, the main controller 210 may include a speed calculator 520, a power calculator 521, a power controller 523, and a speed controller 540.

The speed calculator 520 may calculate a speed of the drain motor 630, based on the voltage information Sm of the motor 630 received from the inverter controller 430.

Specifically, the speed calculator 520 may calculate a zero crossing for the voltage information Sm of the motor 630 received from the inverter controller 430, and calculate a speed of the drain motor 630 based on the zero crossing.

The power calculator 521 may calculate a power P supplied to the motor 630, based on the output current idc detected by the output current detector E and the DC terminal voltage Vdc detected by the DC terminal voltage detector B.

The power controller 523 may generate a speed command value ω*r based on the power P calculated by the power calculator 521 and a preset power command value P*r.

For example, the power controller 523 may generate the speed command value ω*r, while a PI controller 525 performs PI control, based on a difference between the calculated power P and the power command value P*r.

Meanwhile, the speed controller 540 may generate a voltage command value Sn, based on the speed calculated by the speed calculator 520 and the speed command value ω*r generated by the power controller 523.

Specifically, the speed controller 540 may generate the voltage command value Sn, while a PI controller 544 performs PI control, based on a difference between the calculated speed and the speed command value ω*r.

The generated voltage command value Sn may be output to the inverter controller 430.

The inverter controller 430 may receive the voltage command value Sn from the main controller 210, and generate and output an inverter switching control signal Sic in the PWM scheme.

The output inverter switching control signal Sic may be converted into a gate drive signal in a gate driver (not shown), and the converted gate drive signal may be input to a gate of each switching device in the inverter 420. Thus, each of the switching devices Sa, S'a, Sb, S'b, Sc and S'c in the inverter 420 performs a switching operation. Accordingly, the power control can be performed stably.

Meanwhile, during drainage, the main controller 210 according to the embodiment of the present disclosure may control the power supplied to the drain motor 630 to be constant without decreasing over time. Accordingly, the drainage time may be reduced.

Meanwhile, the main controller 210 according to the embodiment of the present disclosure may perform power control on the drain motor 630 at the start of drainage, and, when the remainder of the water is reached, may finish the power control. Accordingly, drainage operation may be performed efficiently.

The main controller 210 according to an embodiment of the present disclosure may control the voltage command value Sn and a duty of the switching control signal Sic to be greater as the output current io is at a smaller level. Accordingly, the motor 630 can be driven with a constant power.

The drain motor 630 according to an embodiment of the present disclosure may be implemented as a brushless DC motor 630. Accordingly, the power control, rather than constant-speed control, can be implemented in a simple manner.

Meanwhile, the main controller 210 according to another embodiment of the present disclosure may be configured to increase the speed of the drain motor 630 during the drainage if the power supplied to the motor 630 does not reach the first power and to decrease the speed of the drain motor 630 if the power supplied to the motor 630 exceeds the first power.

Meanwhile, the main controller 210 according to the embodiment of the present disclosure may control the speed of the motor 630 to be constant, if the power supplied to the motor 630 reaches the first power.

Since the power control allows for driving at constant power as described above, the converter 410 supplies constant power, thereby improving the stability of the converter 410. Also, the power control allows for minimizing a decrease in drainage performance according to installation conditions.

Moreover, the drain motor 630 may be driven stably, and, therefore, the drainage time may be reduced.

Figure 7:
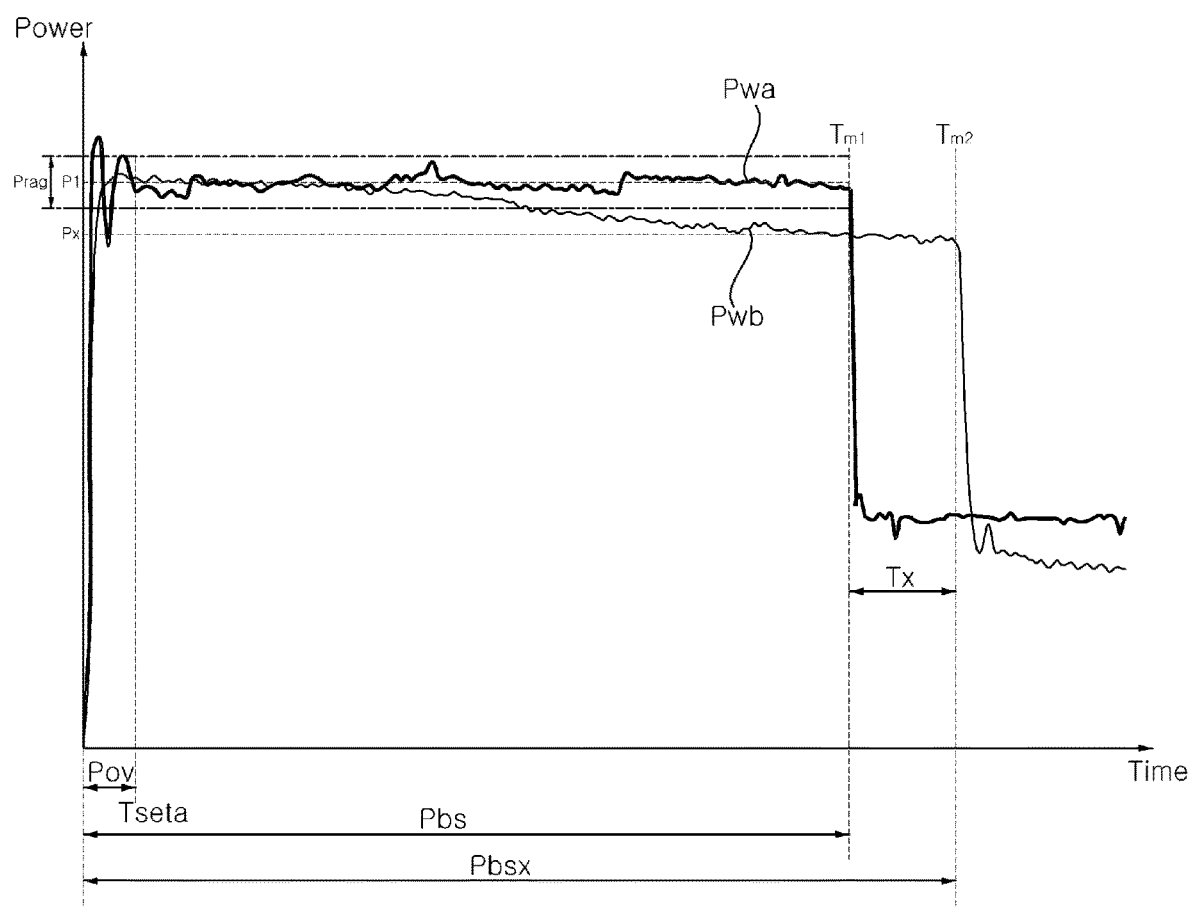
FIG. 7 is a view showing power supplied to a motor according to power control and speed control.

FIG. 7 is a view showing power supplied to a motor according to power control and speed control.

When the power control is performed as in the embodiments of the present disclosure, a time-dependent waveform of the power supplied to the motor 630 may be exemplified as Pwa.

FIG. 7 illustrates that the power is maintained in a substantially constant manner until time point Tm1 by performing the power control, and the power control is terminated at time point Tm1.

By performing the power control, the main controller 210 may control the power supplied to the motor 630, during the drainage, to be constant without decreasing over time, although the water level in the washing tub 120 decreases.

By performing the power control, the main controller 210 may control the power supplied to the motor 630, during the drainage, to be the first power P1.

In particular, even if the lift is changed, the main controller 210 may control the power supplied to the motor 630, during the drainage, to be the constant first power P1, by performing the power control.

At this time, the constant first power P1 may mean that the motor 630 is driven with a power within a first allowable range Prag based on the first power P1. For example, the power within the first allowable range Prag may be a power pulsating within about 10% based on the first power P1.

In FIG. 7, it is illustrated that when the power control is performed, the motor 630 is driven with a power within the first allowable range Prag based on the first power P1 from time point Tseta until time point Tm1 when the drainage is completed, excluding an overshooting period Pov. Accordingly, water pumping can be performed smoothly even if the lift is changed during the drainage. In addition, the stability of the converter 410 can be improved.

Here, the first allowable range Prag may be greater as the first power P1 is at a higher level. In addition, the first allowable range Prag may be greater as a drainage completion period Pbs is longer.

That is, when the lift is at a reference level Iref, the main controller 210 may control the motor 630 to be driven with a power within the first allowable range Prag based on the first power P1, without decreasing over time, from first time point Tseta after the drainage is started until time point Tm1 when the drainage is completed, and when the lift is at a second level, the main controller 210 may control the motor 630 to be driven with a power within the first allowable range Prag based on the first power P1, without decreasing over time, from first time point Tseta until time point Tm1 when the drainage is completed.

To this end, when the power control is performed during the drainage, the main controller 210 may calculate a power based on the output current io and the DC terminal voltage Vdc and output a voltage command value Sn based on the calculated power, and the inverter controller 430 may output a switching control signal Sic to the motor 630 based on the voltage command value Sn.

Meanwhile, the main controller 210 may control the voltage command value Sn and a duty of the switching control signal Sic to be greater as the output current io is at a smaller level. Accordingly, the motor 630 can be driven with a constant power.

Meanwhile, the main controller 210 may control the power supplied to the drain motor 630 to increase abruptly during a period PoV to perform power control.

Meanwhile, the main controller 210 may control the power supplied to the drain motor 630 to decrease abruptly from the time point Tm1.

Unlike the embodiments of the present disclosure, when the speed control is performed, that is, when the speed of the drain motor 630 is controlled to be maintained constantly, a time-dependent waveform of the power supplied to the motor 630 may be exemplified as Pwb.

In the drawing, it is illustrated that the speed control is performed until time point Tm2, and the speed control is terminated at time point Tm2.

The waveform Pwb of the power based on the speed control indicates that the power supplied to the motor 630 may be gradually reduced, while the speed of the motor 630 is constant, as the water level in the washing tub decreases during the drainage.

In FIG. 7, it is illustrated that, during a speed control period Pbsx, the power supplied to the motor 630 is gradually reduced up to approximately Px at time point Tm2 when the drainage is completed.

Accordingly, the time when the operation of the motor 630 is terminated in a case where the speed control is performed is Tm2, which is delayed by approximately period Tx, when compared to that in a case where the power control is performed.

Consequently, according to the embodiments of the present disclosure, since the power control is performed during the drainage, the drainage time can be shortened by approximately period Tx, when compared to that in the case where the speed control is performed. In addition, the power supplied from the converter 410 can be kept constant, thereby improving the operation stability of the converter 410.

Figure 8:
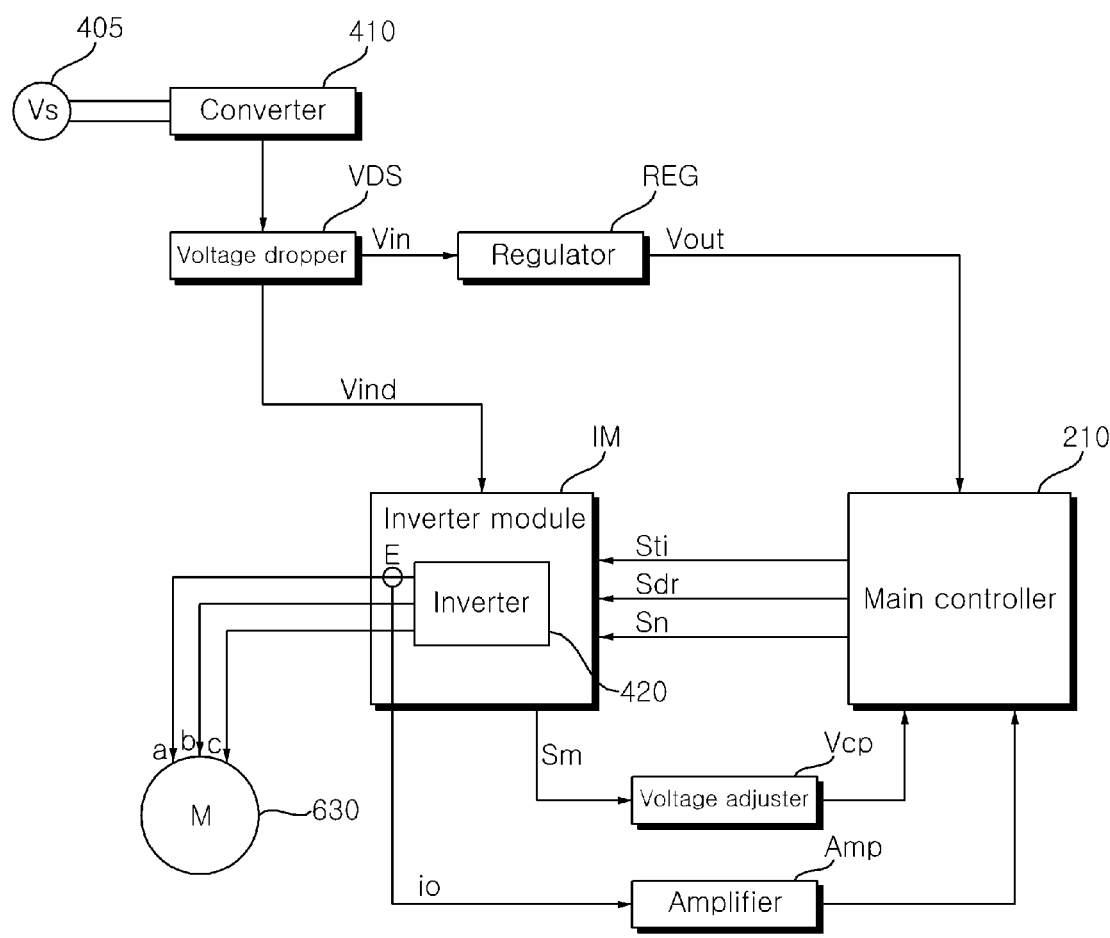
FIG. 8 illustrates an example of an internal block diagram of a drain pump driving apparatus according to an embodiment of the present disclosure.
Figure 9:
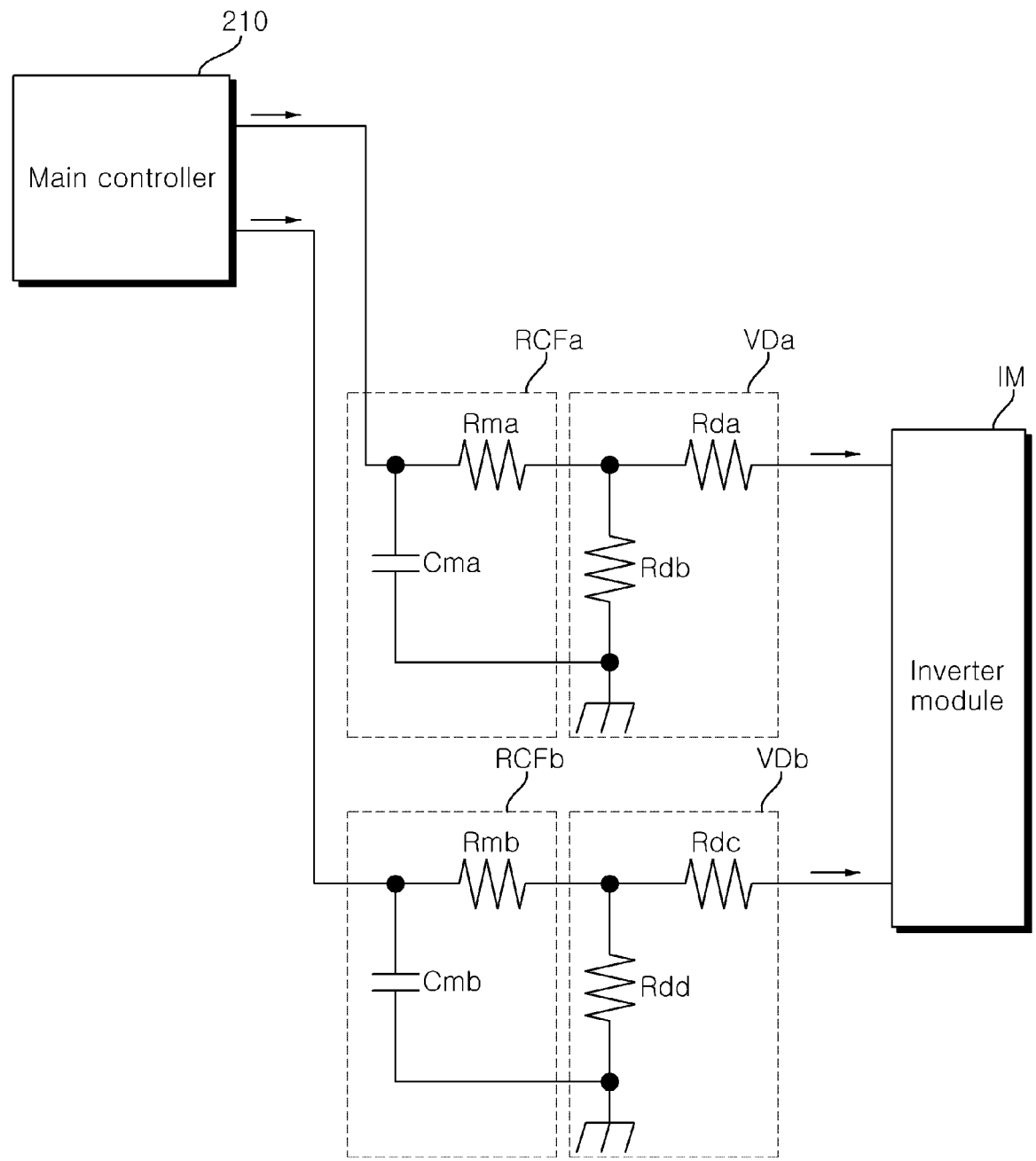
FIGS. 9 to 11 are views referred to in the description of FIG. 8.
Figure 10:
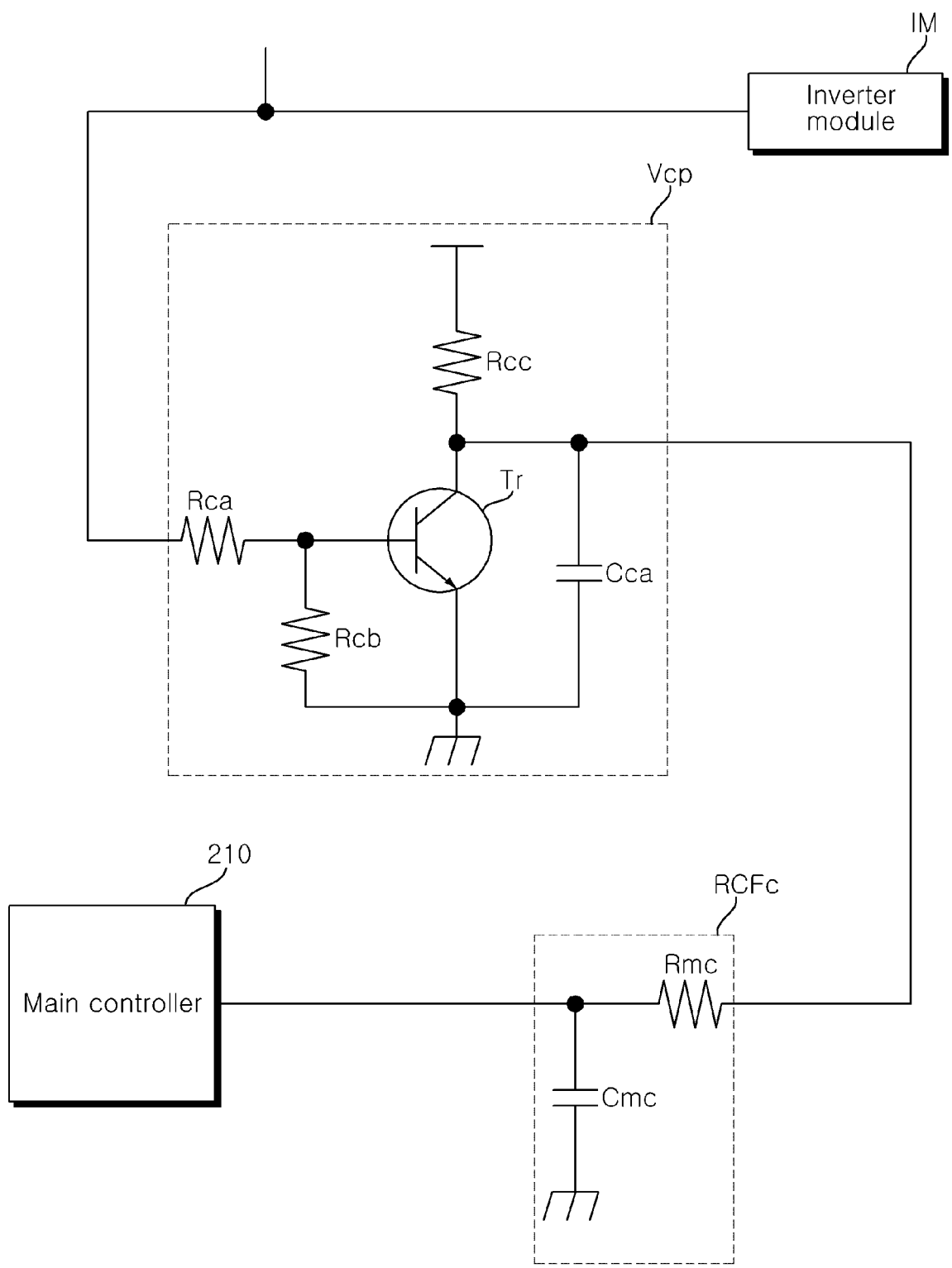
Figure 11:
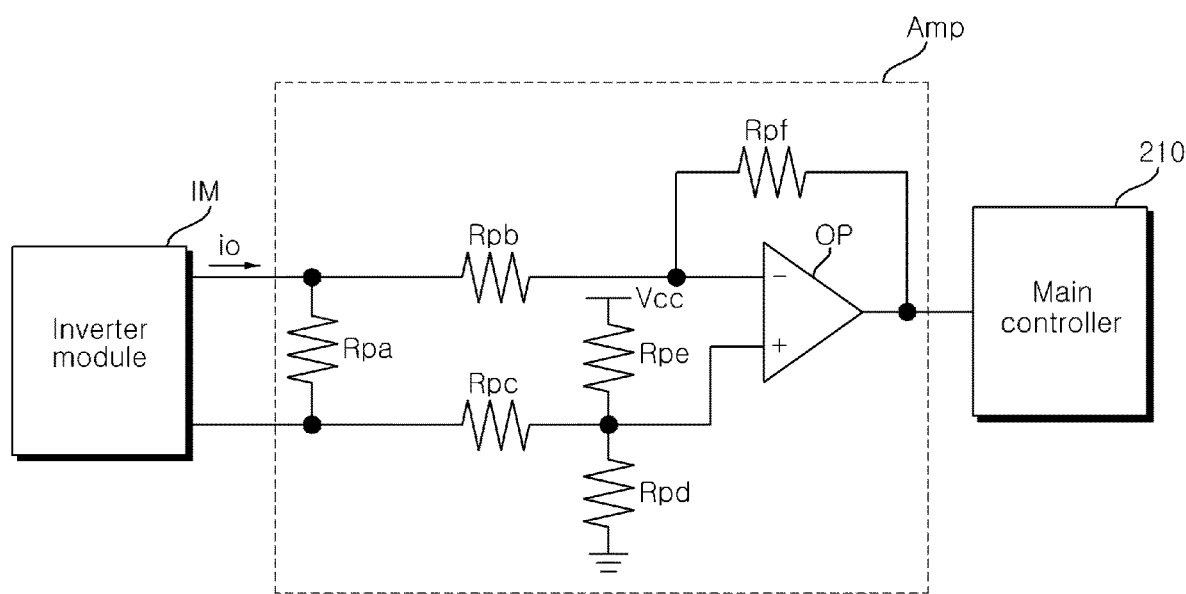

FIG. 8 illustrates an example of an internal block diagram of a drain pump driving apparatus according to an embodiment of the present disclosure. FIGS. 9 to 11 are views referred to in the description of FIG. 8.

First of all, referring to FIG. 8, the drain pump driving apparatus 620 according to an embodiment of the present disclosure may include a converter 410 for converting an alternating current (AC) voltage into direct current (DC) voltage, a voltage dropper VDS for dropping a DC voltage from the converter 410, an inverter module IM that operates based on a first voltage Vind from the voltage dropper VDS and outputs converted AC voltage to a drain pump motor 630 by a switching operation, and a main controller 210 that operates based on a second voltage Vin from the voltage dropper VDS and controls the inverter module IM.

The converter 410, the inverter module IM, and the main controller 210 may correspond to the converter described with reference to FIGS. 5 and 6.

Meanwhile, the inverter module IM may include an inverter 420 and an inverter controller 430.

The main controller 210 may output a timer signal Sti, a rotational direction signal Sdr, and a voltage command value Sn.

As described above, the inverter controller 430 may generate a switching control signal Sic and output it to the inverter 420, based on the voltage command value Sn.

Meanwhile, the timer signal Sti, rotational direction signal Sdr, and voltage command value Sn may be inputted into the inverter module IM through the RC filter RCFa and RCFb and voltage distribution sections VDa and VDb illustrated in FIG. 9.

That is, the drain pump driving apparatus 620 according to an embodiment of the present disclosure may further include RC filter RCFa and RCFb for performing RC filtering on signals outputted from the main controller 210 and voltage distribution sections VDa and VDb for performing voltage distribution on signals filtered by the RC filter RCFa and RCFb and outputting the voltage-distributed signals to the inverter module IM. Accordingly, it is possible to perform stable signal input into the inverter module IM.

Meanwhile, the drain pump driving apparatus 620 according to an embodiment of the present disclosure may further include a regulator REG for converting the level of the second voltage Vin from the voltage dropper VDS and outputting a converted third voltage Vout to the main controller 210.

In this case, the level of the third voltage Vout may be lower than the level of the first voltage Vind. By means of the regulator REG, the third voltage Vout may be stably outputted to the main controller 210, and therefore the drain motor may be stably driven.

Meanwhile, the drain pump driving apparatus 620 according to an embodiment of the present disclosure may further include a voltage adjuster Vcp that adjusts the level of voltage information Sm of the motor 630 outputted from the inverter module IM and outputs the adjusted voltage information Sm to the main controller 210. Accordingly, it is possible to adjust the voltage difference between the inverter module and the controller.

FIG. 10 illustrates an internal circuit diagram of the voltage adjuster Vcp.

Referring to the drawing, the voltage adjuster Vcp has a transistor Tr, and may adjust the level of the voltage information Sm of the motor 630 outputted from the inverter module IM and output the adjusted voltage information Sm, based on the turn-on of the transistor Tr.

Meanwhile, the drain pump driving apparatus 620 according to an embodiment of the present disclosure may further include an RC filter section RCFc that is disposed at an output of the voltage adjuster Vcp and performs RC filtering on signals outputted from the voltage adjuster Vcp. Accordingly, it is possible to remove noise in the signals outputted from the voltage adjuster Vcp.

Meanwhile, the main controller 210 may calculate the speed of the motor 630 based on the voltage information Sm of the motor 630. Also, the main controller 210 may output a voltage command Sn based on the voltage information Sm of the motor 630.

Meanwhile, the inverter module IM may further include an output current detector E.

Accordingly, the inverter module IM may output information regarding the output current io flowing in the motor 630.

Meanwhile, the drain pump driving apparatus 620 according to an embodiment of the present disclosure may further include an amplifier Amp that amplifies the output current io from the inverter module IM flowing in the motor 630 and outputs information regarding the amplified output current io to the main controller 210.

Accordingly, the main controller 210 may receive information regarding the amplified output current io and generate a correct voltage command value Sn. Accordingly, it is possible to stably drive the drain motor.

FIG. 11 illustrates an internal circuit diagram of the amplifier Amp.

Referring to the drawing, the output current io from the inverter module IM is voltage-distributed by a plurality of resistance elements Rpa, Rpb, Rpc, Rpd, Rpe, and Rpf, and the voltage-distributed output current io is amplified by an operational amplifier OP amp and information regarding the amplified output current io is inputted into the main controller 210.

That is, the amplifier Amp may include an operational amplifier OP amp for amplifying the output current io. Accordingly, it is possible to stably drive the drain motor.

Figure 12:
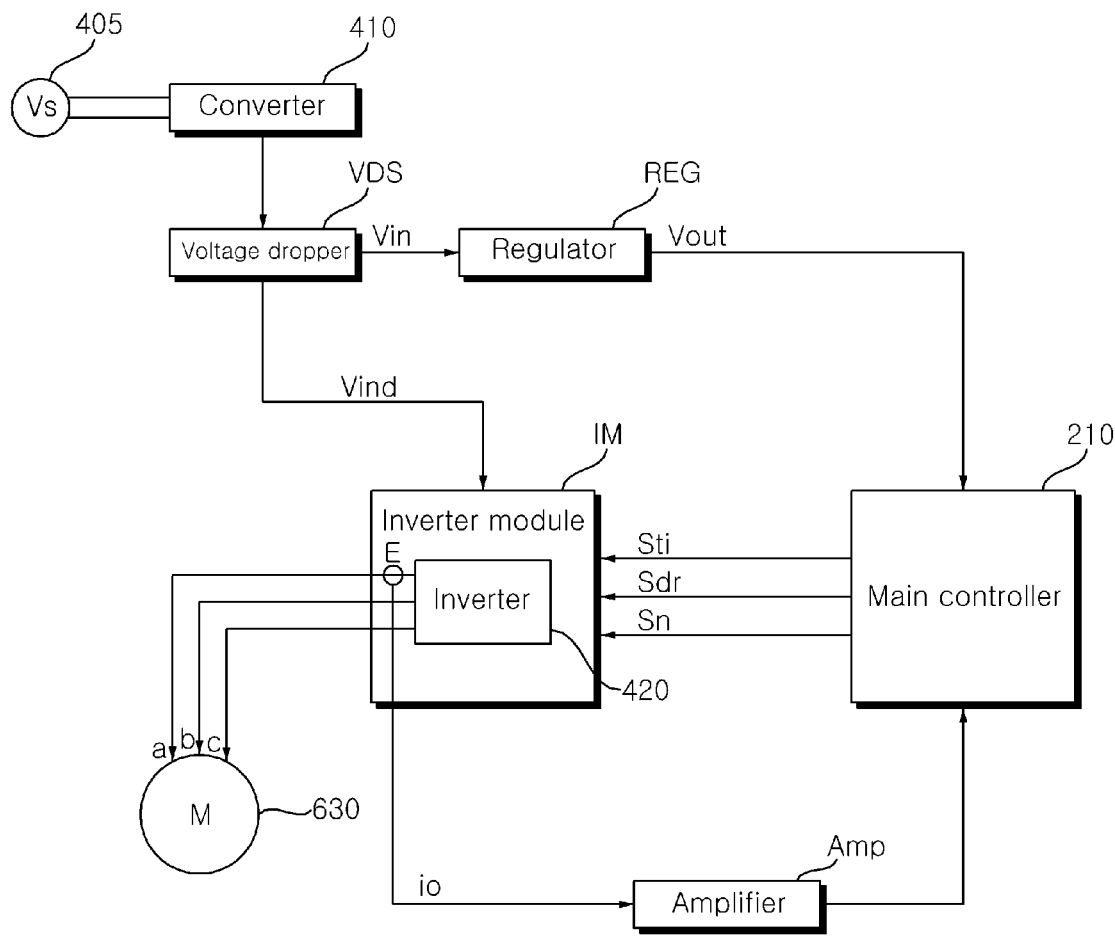
FIG. 12 illustrates an example of an internal block diagram of a drain pump driving apparatus according to another embodiment of the present disclosure.

FIG. 12 illustrates an example of an internal block diagram of a drain pump driving apparatus according to another embodiment of the present disclosure.

Referring to the drawing, the drain pump driving apparatus 620b of FIG. 12 is similar to the drain pump driving apparatus 620 of FIG. 8 but different in that it has no voltage adjuster Vcp.

Referring to the drawing, the drain pump driving apparatus 620 according to another embodiment of the present disclosure may include a converter 410 for converting an alternating current (AC) voltage into direct current (DC) voltage, a voltage dropper VDS for dropping a DC voltage from the converter 410, an inverter module IM that operates based on a first voltage Vind from the voltage dropper VDS and outputs converted AC voltage to a drain pump motor 630 by a switching operation, and a main controller 210 that operates based on the first voltage Vind from the voltage dropper VDS and controls the inverter module IM.

In this case, it is desirable that the voltage Vind applied to the inverter module IM and the voltage Vout applied to the main controller 210 are the same. Accordingly, it is possible to omit the voltage adjuster between the inverter module IM and the main controller 210.

Figure 13:
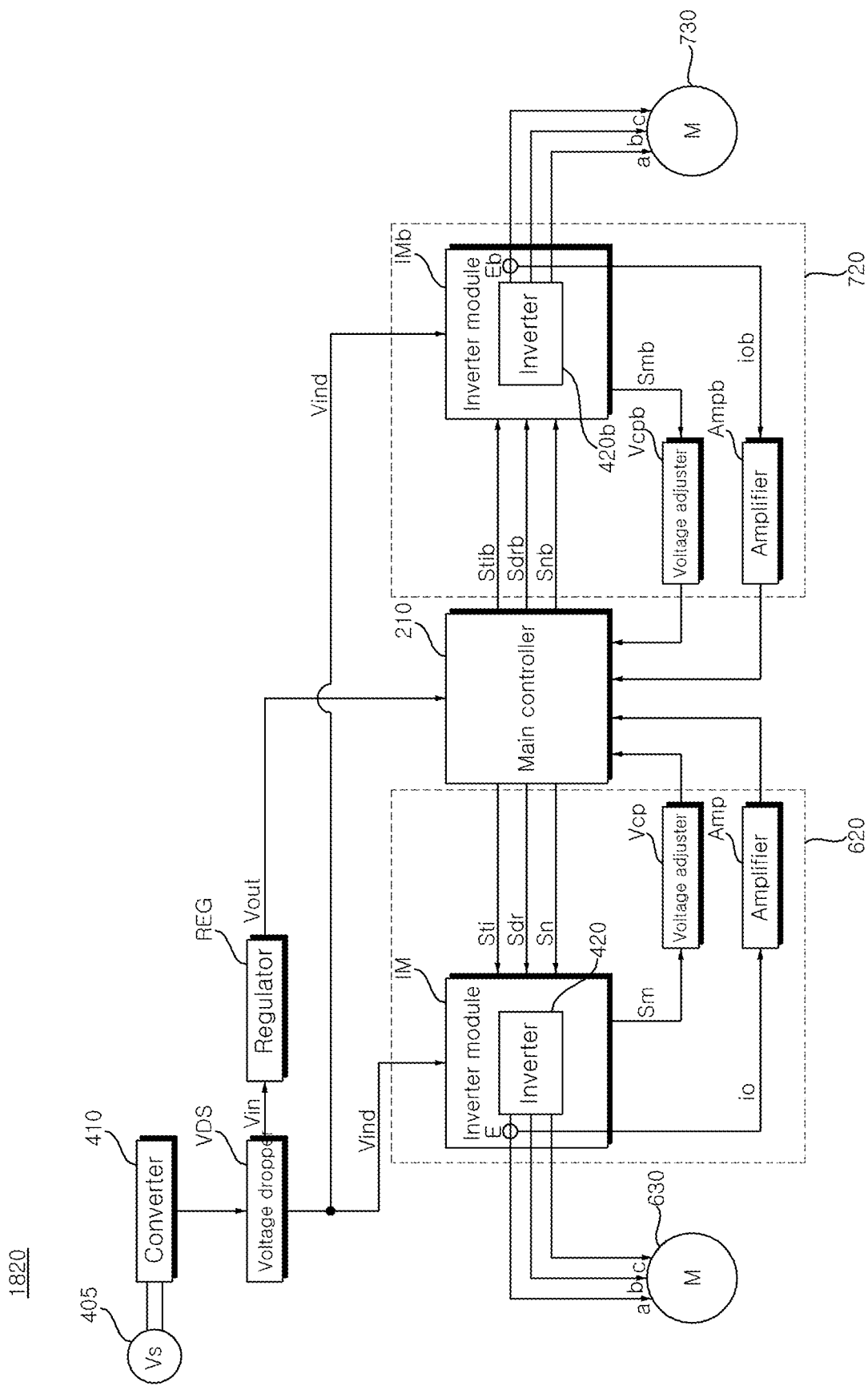
FIG. 13 illustrates an example of an internal block diagram of a drain pump driving apparatus according to yet another embodiment of the present disclosure.

FIG. 13 illustrates an example of an internal block diagram of a drain pump driving apparatus according to yet another embodiment of the present disclosure.

Referring to the drawing, similarly to FIG. 8, the drain pump driving apparatus 620 according to yet another embodiment of the present disclosure may include a converter 410, a regulator REG, an inverter module IM for outputting a converted AC voltage to a drain pump motor 630 by a switching operation, and a main controller 210 for controlling the inverter module IM.

Meanwhile, as opposed to FIG. 8, the drain pump driving apparatus 620 according to yet another embodiment of the present disclosure may further include a second inverter module IMb that operates based on a first voltage Vind from a voltage dropper VDS and outputs converted AC voltage to a circulation pump motor 730 by a switching operation. The main controller 210 may control the second inverter module IMb. Accordingly, it is possible to perform simultaneous control the drain pump motor 630 and the circulation pump motor 730 by means of the main controller 210.

Meanwhile, the second inverter module IMb may include a second inverter 420b and a second inverter controller (not shown).

The main controller 210 may output a timer signal St, a rotational direction signal Sdr, and a voltage command Sn to the inverter module IM and output a second timer signal Stib, a second rotational direction signal Sdrb, and a second voltage command Snb to the second inverter module IMb.

As described above, the inverter controller 430 may generate a switching control signal Sic and output it to the inverter 420, based on the voltage command value Sn.

The second inverter controller (not shown) may generate a second switching control signal Sicb based on the second voltage command value Snb and generate a switching control signal Sic and output it to the second inverter 420b based on the voltage command value Sn.

Meanwhile, the second timer signal Stib, second rotational direction signal Sdrb, and second voltage command Snb may be inputted into the second inverter module IMb through the RC filter RCFa and RCFb and voltage distribution sections VDa and VDb illustrated in FIG. 9.

Meanwhile, a drain pump driving apparatus 1820 according to an embodiment of the present disclosure may further include a second voltage adjuster Vcpb that adjusts the level of second voltage information Smb of the circulation pump motor 730 outputted from the second inverter module IMb and outputs the adjusted second voltage information Smb to the main controller 210. Accordingly, it is possible to adjust the voltage difference between the second inverter module IMb and the main controller 210.

Meanwhile, the second voltage adjuster Vcpb may include such an internal circuit as shown in FIG. 10.

Meanwhile, the drain pump driving apparatus 1820 according to yet another embodiment of the present disclosure may further include an RC filter (not shown) for performing RC filtering on signals outputted from the second voltage adjuster Vcpb.

Meanwhile, the main controller 210 may calculate the speed of the circulation pump motor 730 based on the second voltage information Smb of the motor 730. Also, the main controller 210 may output a second voltage command Snb based on the second voltage information Smb of the circulation pump motor 730.

Meanwhile, the second inverter module IMb may further include an output current detector Eb.

Accordingly, the second inverter module IMb may output information regarding the output current iob flowing in the circulation pump motor 730.

Meanwhile, the drain pump driving apparatus 1820 according to yet another embodiment of the present disclosure may further include a second amplifier Ampb that amplifies the second output current iob from the second inverter module IMb flowing in the circulation pump motor 730 and outputs information regarding the amplified output current iob to the main controller 210.

Accordingly, the main controller 210 may receive information regarding the amplified output current iob and generate a correct second voltage command value Snb. Accordingly, it is possible to stably drive the circulation pump motor 730.

Meanwhile, the second amplifier Ampb may be configured like the circuit of FIG. 11.

Meanwhile, FIG. 1 illustrates a top loading type machine as a laundry treatment machine, but the drain pump driving apparatus 620 according to an embodiment of the present disclosure may also be applied to a front loading type machine, that is, a drum type machine.

Meanwhile, the drain pump driving apparatus 620, 620b, and 1820 according to embodiments of the present disclosure may be applied to various machines such as dishwashers and air conditioners, in addition to the laundry treatment machine 100.

The drain pump driving apparatus and the laundry treatment machine including the same according to embodiments of the present disclosure are not limited to the configurations and methods of the above-described embodiments, and various modifications to the embodiments may be made by selectively combining all or some of the embodiments.

Meanwhile, a method for operating the drain pump driving apparatus and the laundry treatment machine according to the present disclosure can be implemented with processor-readable codes in a processor-readable recording medium provided for each of the drain pump driving apparatus and the laundry treatment machine. The processor-readable recording medium includes all kinds of recording devices for storing data that is readable by a processor.

It will be apparent that, although the preferred embodiments of the present disclosure have been illustrated and described above, the present disclosure is not limited to the above-described specific embodiments, and various modifications can be made by those skilled in the art without departing from the gist of the present disclosure as claimed in the appended claims. The modifications should not be understood separately from the technical spirit or prospect of the present disclosure.

What is claimed is:

1. A drain pump driving apparatus comprising:
   a converter to convert alternating current (AC) voltage into direct current (DC) voltage;
   a voltage dropper to drop the DC voltage from the converter;
   an inverter module to operate based on a first voltage from the voltage dropper and to output AC voltage converted by a switching operation to a drain pump motor;
   a controller to operate based on a second voltage from the voltage dropper and to control the inverter module;
   a voltage adjuster to adjust the level of voltage information of the motor outputted from the inverter module and to output the adjusted voltage information to the controllers; and
   an amplifier to amplify the output current flowing in the motor outputted from the inverter module and to output information regarding the amplified output current to the controller,
   wherein the inverter module comprises an output current detector to detect an output current flowing in the drain pump motor,
   wherein the controller is configured to perform a power control based on the output current from the output current detector, and to output a switching control signal based on the power control.

2. The drain pump driving apparatus of claim 1, further comprising a regulator to convert the level of the second voltage from the voltage dropper and to output a converted third voltage to the controller,
   wherein the level of the third voltage is lower than the level of the first voltage.

3. The drain pump driving apparatus of claim 1, further comprising:
   an RC filter for filtering signal outputted from the controller; and
   a voltage distributor for performing voltage distribution of signal filtered by the RC filter and outputting the voltage-distributed signals to the inverter module.

4. The drain pump driving apparatus of claim 2, further comprising an RC filter for filtering signal outputted by the voltage adjuster,
   wherein the voltage adjuster includes a transistor and adjusts the level of the voltage information of the motor outputted from the inverter module and outputs the adjusted voltage information, based on the turn-on of the transistor.

5. The drain pump driving apparatus of claim 1, wherein the amplifier comprises an operational amplifier for amplifying the output current flowing in the motor outputted from the inverter module.

6. The drain pump driving apparatus of claim 1, wherein the controller outputs a timer signal, a rotational direction signal, and a voltage command value to the inverter module.

7. The drain pump driving apparatus of claim 1, wherein the controller calculates the speed of the motor based on the voltage information of the motor.

8. The drain pump driving apparatus of claim 1, further comprising a second inverter module to operate based on the first voltage from the voltage dropper and to output converted AC voltage by a switching operation to a circulation pump motor,
   wherein the controller controls the second inverter module.

9. The drain pump driving apparatus of claim 8, further comprising a second amplifier to amplify the output current from the second inverter module flowing in the circulation pump motor and to output information regarding the amplified output current to the controller.

10. The drain pump driving apparatus of claim 8, further comprising a second voltage adjuster to adjust the level of voltage information of the circulation pump motor outputted from the second inverter module and to output the adjusted voltage information to the controller.

11. A drain pump driving apparatus comprising:
    a converter to convert alternating current AC) voltage into direct current (DC) voltage;
    a voltage dropper to drop the DC voltage from the converter;
    an inverter module to operate based on a first voltage from the voltage dropper and to output AC voltage converted by a switching operation to a drain pump motor;
    a controller to operate based on the first voltage from the voltage dropper and to control the inverter module; and
    an amplifier to amplify the output current flowing in the motor outputted from the inverter module and to output information regarding the amplified output current to the controller,
    wherein the inverter module comprises an output current detector to detect an output current flowing in the drain pump motor,
    wherein the controller is configured to perform a power control based on the output current from the output current detector, and to output a switching control signal based on the power control.

12. A laundry treatment machine comprising:
    a washing tub;
    a driver to drive the washing tub;
    a drain pump; and
    a drain pump driving apparatus to drive the drain pump,
    wherein the drain pump driving apparatus comprises:
        a converter to convert alternating current (AC) voltage into direct current (DC) voltage;
        a voltage dropper to drop the DC voltage from the converter;
        an inverter module to operate based on a first voltage from the voltage dropper and to output AC voltage converted by a switching operation to a drain pump motor;
        a controller to operate based on a second voltage from the voltage dropper and to control the inverter module;
        a voltage adjuster to adjust the level of voltage information of the motor outputted from the inverter module and to output the adjusted voltage information to the controller; and an amplifier to amplify the output current flowing in the motor outputted from the inverter module and to output information regarding the amplified output current to the controller, wherein the inverter module comprises an output current detector to detect an output current flowing in the drain pump motor, wherein the controller is configured to perform a power control based on the output current from the output current detector, and to output a switching control signal based on the power control.

13. The laundry treatment machine of claim 12, wherein the drain pump driving apparatus further comprises a regulator to convert the level of the second voltage from the voltage dropper and to output a converted third voltage to the controller, wherein the level of the third voltage is lower than the level of the first voltage.

14. The laundry treatment machine of claim 12, wherein the drain pump driving apparatus further comprises:
an RC filter for filtering signal outputted from the controller; and
a voltage distributor for performing voltage distribution of signal filtered by the RC filter and outputting the voltage-distributed signals to the inverter module.

15. The laundry treatment machine of claim 13, wherein the drain pump driving apparatus further comprises an RC filter for filtering signal outputted by the voltage adjuster, wherein the voltage adjuster includes a transistor and adjusts the level of the voltage information of the motor outputted from the inverter module and outputs the adjusted voltage information, based on the turn-on of the transistor.

16. The laundry treatment machine of claim 12, wherein the amplifier comprises an operational amplifier for amplifying the output current flowing in the motor outputted from the inverter module.

17. The laundry treatment machine of claim 12, further comprising a second inverter module to operate based on the first voltage from the voltage dropper and to output converted AC voltage by a switching operation to a circulation pump motor, wherein the controller controls the second inverter module.

18. The laundry treatment machine of claim 17, further comprising a second amplifier to amplify the output current from the second inverter module flowing in the circulation pump motor and to output information regarding the amplified output current to the controller.

* * * * *